US011120176B2

(12) United States Patent
Wang et al.

(10) Patent No.: US 11,120,176 B2
(45) Date of Patent: Sep. 14, 2021

(54) OBJECT COUNT ESTIMATION BY LIVE OBJECT SIMULATION

(71) Applicant: Oracle International Corporation, Redwood Shores, CA (US)

(72) Inventors: Anping Wang, San Ramon, CA (US); Kendra Mariko Chen, Shoreline, WA (US); Hyunjung Lee, Santa Clara, CA (US); John Patrick Connelly, Santa Cruz, CA (US); Vernon W. Hui, Bellevue, WA (US); Sanjeev Khodaskar, Sunnyvale, CA (US); Jeevan Gheevarghese Joseph, Dublin, CA (US); Matthew P. Abrams, Las Cruces, NM (US)

(73) Assignee: Oracle International Corporation, Redwood Shores, CA (US)

( * ) Notice: Subject to any disclaimer, the term of this patent is extended or adjusted under 35 U.S.C. 154(b) by 491 days.

(21) Appl. No.: 15/797,652

(22) Filed: Oct. 30, 2017

(65) Prior Publication Data

US 2018/0322229 A1    Nov. 8, 2018

Related U.S. Application Data

(60) Provisional application No. 62/500,883, filed on May 3, 2017.

(51) Int. Cl.
*G06F 30/20* (2020.01)
*H04L 29/06* (2006.01)

(52) U.S. Cl.
CPC ............ *G06F 30/20* (2020.01); *H04L 65/602* (2013.01); *H04L 65/80* (2013.01)

(58) Field of Classification Search
CPC ........ G06F 30/20; H04L 65/602; H04L 65/80
See application file for complete search history.

(56) References Cited

U.S. PATENT DOCUMENTS

| | | | |
|---|---|---|---|
| 2007/0038516 A1* | 2/2007 | Apple | G06Q 30/02 705/14.42 |
| 2008/0189408 A1* | 8/2008 | Cancel | G06Q 10/04 709/224 |
| 2012/0047013 A1* | 2/2012 | Bigby | G06Q 30/02 705/14.52 |
| 2016/0005073 A1* | 1/2016 | Connelly | G06Q 30/0255 705/14.53 |

(Continued)

*Primary Examiner* — Chuen-Meei Gan
(74) *Attorney, Agent, or Firm* — Kilpatrick Townsend & Stockton LLP

(57) ABSTRACT

Techniques are provided to quickly process stored objects to generate an accurate estimate of the number of live objects that will be responsive to a client's filtering request defined at least in part based on a filtering parameter. Stored objects generated from user interactions with webpages are modified to simulate live objects and processed by a live object-intake simulator. The simulated results are then filtered using the filtering parameter to form a subset of matching objects. An estimate of the number of live objects produced by the filtering parameter is generated using at least the count of the objects in the subset. A confidence metric of the estimate is computed, in some cases using a statistical model. Under certain conditions, the estimate is delivered, the confidence metric is delivered, and/or live object intake based on the filtering parameter is initiated.

14 Claims, 6 Drawing Sheets

(56) References Cited

U.S. PATENT DOCUMENTS

| | | | | |
|---|---|---|---|---|
| 2016/0027055 A1* | 1/2016 | Dixon | ............... | G06Q 30/0261 |
| | | | | 705/14.58 |
| 2016/0055527 A1* | 2/2016 | Wiener | ............. | G06Q 30/0255 |
| | | | | 705/14.53 |
| 2016/0125471 A1* | 5/2016 | Hsu | .................... | G06Q 30/0269 |
| | | | | 705/14.66 |
| 2016/0328422 A1* | 11/2016 | Noels | ...................... | G06F 16/21 |
| 2017/0193382 A1* | 7/2017 | Villa | .................. | G06F 16/2228 |
| 2017/0220612 A1* | 8/2017 | Crossley | ............ | G06F 16/3349 |

\* cited by examiner

OBJECT COUNT ESTIMATION BY LIVE OBJECT SIMULATION

CROSS-REFERENCES TO RELATED APPLICATIONS

This application claims the benefit of and the priority to U.S. Provisional Patent Application No. 62/500,883 filed on May 3, 2017, entitled "CAMPAIGN SIMULATION," which is hereby incorporated by reference in its entirety for all purposes.

BACKGROUND

Object requests can identify particular parameters, so as to correspond to a request for information associated with each object in a data store that matches the parameter. However, a response to such a request may be of variable utility depending on a quantity of parameter-matching objects. Further, it can be difficult to estimate the quantity based on (for example) object structure variability, dynamic changes as to which objects are present in a data store, and limited access to object data.

BRIEF SUMMARY

As users interact with computers and/or webpages, data (e.g. objects, files, data records or log messages) can be generated that identify many details corresponding to the interactions (e.g., identifying the webpage, interaction type, involved content object, time, user device type, browser type, user login identifier, etc.). Live objects corresponding to these interactions are generated as the interactions occur and are distributed based on active live object requests. A request can be received for a subset of the generated live objects, and the subset can be defined by one or more filtering parameters identified within the request. More specifically, the one or more filtering parameters can be used to identify select live objects that identify particular characteristics of the represented interactions, where the particular characteristics corresponds to the filtering parameter(s). Each object in the subset can correspond to a specific user and/or specific device, such that a client system can coordinate selective distribution of content to be presented on a webpage to be rendered at corresponding specific user devices. For example, a live object request may include filtering parameters indicative of a user demographic category (e.g., males, age 25-40) and a historical interaction with a webpage object (e.g., clicked on link involving electric cars). Receipt of objects corresponding to the parameters can facilitate the requestor device to selectively transmit a targeted content object (e.g., advertisement for an electric car) to devices predicted (e.g., by a requestor) to be likely to interact with (e.g., click on) the content object.

The utility of receiving a response with a subset identification can depend on a size of the subset. For example, a small subset may result in a determination that the cost of generating or distributing the targeted content object is too high on a per-recipient-device basis. Conversely, a large subset may prohibit distribution of the targeted content object as a result of a total distribution cost being too high. Accordingly, it can be advantageous to generate a preliminary estimate of a size of the subset, which can be used to determine whether to proceed to identify the full subset or to modify the filtering parameter to produce a subset of the right size.

One approach for generating the estimate is to identify a quantity of stored objects (previously received as live objects) that correspond to the filtering parameter(s) and to project an estimate based on the count. In many cases this approach takes too much time to produce a result and can sometimes extend to weeks due to the many millions of stored objects and other factors including the configuration of the stored objects and the storage mechanism. It is also the case that this type of querying stored objects may tax processors and keep them from performing other required real-time tasks.

In a novel enablement, a processor-efficient and timely approach is provided for generating the estimation by simulating the receipt and live processing of objects. The simulation can be performed by updating particular information in the stored objects (e.g., a timestamp), such that each updated stored object appears to be an incoming live object. The stored objects are then processed using the filtering parameter and any applicable constraints or rules to produce a resulting subset of the stored objects that match the filtering parameter. By being configured to effect constraints or rules, the simulation thus provides an environment to process objects in a manner that is more sophisticated than merely implementing a query or filter to identify select objects with a characteristic matching the filtering parameter. For example, the simulation can be configured to apply a rules-based technique for identifying matches or updating a count.

An exemplary rule may indicate that an object is to only trigger an advance of a count of an estimate if the object's characteristic(s) match the filtering parameter and the count does not already reflect an instance corresponding to the object (e.g., the count not having been previously iterated for another object associated with an identifier of a user, device and/or session). To facilitate this processing, data can be merged across objects upon detecting that an object being presently processed includes one or more of the same or corresponding identifiers (e.g., of a user, device and/or session) as one having been previously processed. In effect, a profile may be generated and updated for each unique one or more identifiers, where the profile includes some or all unique elements from the object (e.g., characterizing a user, representing an individual webpage interaction, identifying device characteristics, etc.). An estimated count may be (e.g., dynamically or at an end of a simulation time period) set to a quantity of the profiles (or object, where at least one of the object includes a merged object). It will be appreciated that, when multiple filtering parameters are identified, the simulation may fail to detect each matching merged object until a time at which enough individual object have been merged to produce the particular combination of characteristics corresponding to the parameters.

Another exemplary rule that may be alternatively or additionally applied includes a permission rule. A permission rule may restrict objects for which data can be accessed. For example, a permission rule may identify that a particular client can only filter based on characteristics derived from objects associated with one or more websites of the client. Thus, restricted objects are not included in when determining an estimated count. Further, an object—merging operation may be conducted only when it is determined that two or more underlying object correspond to or include one or more same or corresponding identifiers and also that each of the two or more underlying objects is associated with a website of the one or more websites.

Once the count of that resulting subset of stored objects is known, it may then be used to estimate the number of actual live objects that will be responsive to the filtering parameter. The estimated number of actual live objects may be generated in certain embodiments by extrapolation using the count of the resulting subset of stored objects, the time required to process the resulting subset, the total number of stored objects processed to produce the subset of stored objects, and the desired time period of the live object collection required. If the estimated number indicates a too small data set or a too large data set, the filtering parameter may be adjusted to increase or decrease the data set count.

Thus, some embodiments process a portion of stored data to generate and update merged objects and/or filter outputs. These results can be iteratively updated based on additional portions of the stored data, such that an impact of real-time data is simulated. In one instance, enough stored data is processed so as to simulate a continuous or near-continuous real-time stream of data from one or more sources. That is, repeated iterative processing of stored data can simulate processing of real-time data (received from one or more sources). A count is therefore not generated based on a comprehensive data set that has been built over long time periods (and may be at least partly outdated) and/or that is at least partly not accessible to a given client. Rather, a count is generated by using stored data to predict how request-tracking structures (e.g., merged objects and/or filtered objects) will evolve in time during real-time processing so as to predict a count that corresponds to a defined time period.

A confidence metric is also calculated during the simulation and is based on the number of stored objects processed, the number of objects in the subset of stored objects, and other factors. In some cases a statistical model is used to generate the confidence metric. In some embodiments the live object simulation of stored objects continues until the confidence metric reaches a certain threshold. In other embodiments when the confidence metric reaches a threshold or other real-time condition is met, live object intake with the filtering parameter may be initiated.

A first embodiment of this novel approach includes a method of generating and using estimated object counts based on simulations of processing real-time data streams, the method includes receiving a communication that identifies a filtering parameter and corresponds to a request to perform a task action based on a simulated output generated based on the filtering parameter. The method also includes performing a simulation of processing one or more real-time data streams by: retrieving a first plurality of stored objects, each stored object of the first plurality of stored objects having been generated based on an interaction-responsive communication received from a user device; and filtering, by a real-time object-intake system, the first plurality of stored objects using the filtering parameter to produce a first subset of the first plurality of stored objects, each object in the first subset corresponding to the filtering parameter. The method yet includes processing the first subset to identify an object count to associate with the simulation and filtering parameter, the object count identifying a quantity of objects in the first subset that include one or more unique values for one or more particular identifying fields relative to one or more values for the one or more particular identifying fields represented in the quantity, the object count being less than a number of object in the first subset as a result of at least two object in the first subset having one or more non-unique values for the one or more particular identifying fields. The method also includes generating response data that includes an estimated count of a second subset of a second plurality of objects based on the object count, the second plurality of objects including at least some objects expected to be received by the real-time object-intake system subsequent to the identification of the object count, where each object in the second subset corresponding to the filtering parameter. The method further includes performing the task action based on the response data, the task action including transmitting a response to the communication that identifies the estimated count of the response data or effecting an instruction for the real-time object-intake system to filter incoming objects from one or more real-time data streams using the filtered parameter when it is determined, based on the response data, that a real-time filtering condition is satisfied.

Additional enhancements to this novel embodiment may include one or more of the following additional features. A first additional feature is where the response data further includes a confidence metric for the estimated count of the second subset; and the method further includes determining, based on the confidence metric, that the task action is to be performed, where the task action is performed in response to the determination. An additional feature to last described feature is where the confidence metric is generated using a statistical model. Another additional feature is where the filtering parameter includes one or more of: a category identifier (ID); a logical union, intersection, or exclusion of two or more category IDs; a rule, where the rule corresponds to a permission characteristic; a first threshold, where the first threshold corresponds to a frequency of occurrence; and a second threshold, where the second threshold corresponds to a time of occurrence. Yet another feature is where the interaction-responsive communication originated from a web page visit. A further feature is where the object count of the first subset of the first plurality of stored objects is calculated using a HyperLogLog algorithm. Another feature is where the object count includes a quantity of objects in the first subset of the first plurality of stored objects having unique values, relative to other objects represented in the quantity of objects, for each of one or more predefined fields, the one or more predefined fields including a field associated with a user identifier or user device identifier.

Implementations of the novel embodiment may include hardware or computer software on a computer-accessible medium, or a system of one or more computers can be configured to perform the particular operations or actions by virtue of having software, firmware, hardware, or a combination of them installed on the system that in operation causes or cause the system to perform the actions. One or more computer programs can also be configured to perform the particular operations or actions by virtue of including instructions that, when executed by data processing apparatus, cause the apparatus to perform the actions.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The present disclosure is described in conjunction with the appended figures.

Figure 1:
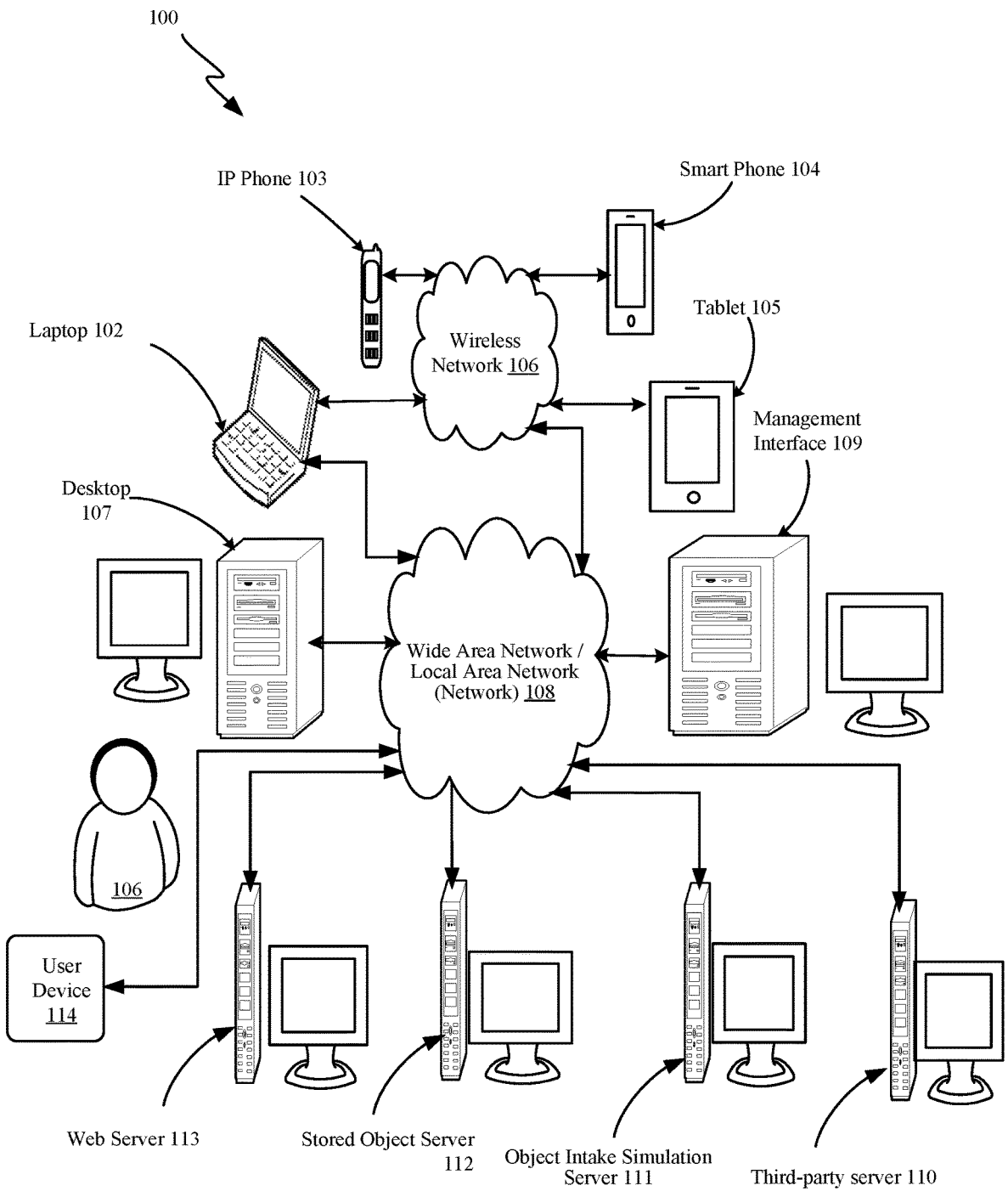
FIG. 1 depicts an environment that supports systems used for simulating user web page visits to generate stored objects.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

The Internet is the world's largest public electronic forum for transferring data sets between systems. Traditionally, data provider networks collect data sets of user data that represent digital interactions between user devices and web servers while the user devices access websites. The data provider networks can then make the collected data sets available to other systems (e.g., data accessing systems or systems that query the data sets) for querying or filtering the collected data sets. A system can use the queried or filtered data sets to customize content on websites for a target group of user devices. Generally, the collected user data can be one of two types: (1) personally identifiable information (PII), which uniquely identifies an individual user device (e.g., email addresses or phone numbers); or (2) non-personally identifiable information (non-PII), which is not specific enough to identify an individual user device (e.g., IP addresses or browser types). Further, the user data can include objects (as described above) and attributes or categories that provide additional detail about the objects. As a non-limiting example, an attribute or category can represent the content of a particular search submitted by a user device to a website, and the user device may be associated with a stored object. Notably, the flow and/or transfer of data sets between data provider networks and the other systems creates a significant data security and privacy concern for users.

Internet privacy laws govern the handling of PII by restricting the transfer of data sets that include PII, so that individual users cannot be identified from the queried or filtered user data. These privacy laws imposed a significant technical burden on data provider networks. In particular, to comply with the privacy laws, data provider networks had to tailor their data collection to avoid collecting PII data of users, even though doing so reduced the effectiveness of website customization. Further, in some cases, data provider networks had to transform PII data into non-PII data so as to de-identify individual users before making the collected data sets available to other systems for querying. Adding to the complexity, even if a data provider network provided a data set that only included the non-PII data of users, the data provider network would still be at risk of violating privacy laws if the non-PII data did not sufficiently anonymize the users represented by the data set. For instance, if the data set was too small or if the user data did not include a sufficient number of categories or attributes, individual users could potentially be identified by combining the non-PII data for a particular user device. Thus, data provider networks experienced the technical problem of providing data sets of user data (which can include complex combinations of PII and/or non-PII data) to other systems in a manner that sufficiently maintained the anonymity of the individual users represented by the data sets.

In light of the technical challenges described above, certain embodiments of the present disclosure provide a technical solution. For instance, in certain embodiments, user interactions with web pages may be enhanced by the addition of content to the web page added as a result of the interactions itself. Initial user interactions form live objects that may be filtered by filtering parameters from pending live object requests. Live objects are generated in real-time as a result of a user visiting a web page. Subsets of live objects matching the filtering parameters are distributed and the additional content is delivered to user devices to be rendered on the web page as a result of processing the distributed matching live objects. The filtering parameters used to filter the live objects control the number of live objects in the resulting subsets. It is important to generate subsets that contain neither too few nor too many live objects in most cases. Accordingly, it is important to form the filtering parameters to generate the correct subsets with the number of live objects that fall into the desired range. A novel approach to forming the filtering parameters is to generate the correct subsets with the correct number of live objects is to accurately estimate the number of live objects in the resulting subset of live objects in a timely manner. If the estimation using the filtering parameters produces subsets that have too many live objects, the filtering parameters may be adjusted to produce a smaller subset. If the estimation produces subsets that have too few live objects, again, the filtering parameters maybe adjusted to produce a larger subset. Accordingly the filtering parameters can then generally produce subsets of live objects during live object processing containing the number of live objects in a particular range of less than too many and more than too few live objects.

Once processed for live object requests, live objects are added to data stores containing past live objects and referred to as "stored objects." These data stores add millions of live objects a day and, therefore, are extremely large, sometimes storing billions of stored objects. One method of estimating the size of a subset of live objects formed by applying a particular filtering parameter is to count the number of stored objects that match the filtering parameters and to make a projection based on that count and the total number of stored objects. This is not a practical way to estimate the size of a subset of live objects because there are too many stored objects to count in a timely manner, and such counting is too processor intensive.

On the other hand, the stored objects can be used to simulate live objects to produce accurate and timely subset size estimates. Stored objects are updated with appropriate tags to make them appear to be incoming live objects and, are processed as live objects using the filtering parameter for a pre-determined amount of time, in some cases. As the stored objects are updated and tagged to simulate live object processing, a subset of those stored objects matching the filtering parameter is created and counted. The estimated count of a subset of live objects that would be produced by the filtering parameter is computed by extrapolation using variables such as the count of the subset of stored objects matching the filtering parameter, the number of stored objects processed, the time it took to process the number of stored objects, and the time period of live object processing required. In some cases a HyperLogLog method is used to count the stored objects matching the filtering parameter. The HyperLogLog method uses a hashing function with uniform distribution qualities on a characteristic of the stored objects matching the filtering parameter such as an user ID or a user device ID. Once the hashing function has uniformly distributed the IDs, the number of stored objects in the subset is computed from the distance between the uniformly distributed IDs. Other counting methods know to those of skill in the art may be used to count stored objects that match the filtering parameter.

Further, a confidence metric may be generated, in some cases based on a statistical model, using the number of stored objects, the number of stored object used in the simulation, and the duration of the simulation. In some embodiments the simulation is performed until a desired confidence metric is achieved. In other embodiments the simulation is performed for a pre-determined amount of time and the associated confidence metric is computed over that pre-determined amount of time. The estimated live object count may be reported based on the confidence metric meeting a threshold. Other actions, such as commencing actual live object filtering based on the filtering parameter may be commenced based on the confidence metric meeting a threshold or other real-time condition being met. Embodiments and systems may be described in more detail in Provisional Patent Application No. 62/500,883 that is incorporated by reference herein in its entirety FIG. 1 depicts a system 100 that supports systems used for simulating stored objects to generate an estimated object count by simulating live object-intake using stored objects. One or more instances of system 100 or any aspect thereof may be implemented in the context of the architecture and functionality of the embodiments described herein. As shown in FIG. 1, system 100 comprises at least one instance of a simulation engine (e.g., object-intake simulation server 111), at least one instance of stored object server 112, at least one instance of web server 113, at least one instance of third-party server 110, at least one instance of management interface 109, and at least one instance of user device 114. User device 114 can represent one of a variety of other devices (e.g., a desktop computer 107, a laptop computer 102, an IP phone 103, a smart phone 104, a tablet 105, etc.) operated by a user 106. The aforementioned servers and devices can communicate through a network 108 (e.g., a wide area network (WAN), a local area network (LAN), etc.).

The aforementioned servers and devices in system 100 are designed and configured to enable a user at user device 114 to visit (e.g., browse) a web page served by web server 113. While browsing the web page, various user data such as user ID and other interactions with the web page are tracked. One of skill in the art will understand that there are many methods that may be implemented to track user data and interactions with a web page including placing cookies on a user device, running scripting languages on a user device placed there from downloading a web page, using commercial analytic tools, etc. These user interactions can be stored at stored object server 112 as stored objects. Stored object server 112 stores millions of objects each day based on user interactions with web pages. Queries to the stored object server 112 are time consuming and processor intensive as a result of the number of stored objects and other issues such as object configuration and the way that the stored objects are stored.

Third-party server 110 initiates live object requests with one or more category IDs or an intersection, union, or exclusion of two or more category IDs. Category IDs are associated with user demographics, user interests, content on webpages users interact with, etc. Category IDs, can identify users in age groups, familial status, marital status, activity interest, consumable interests, personal interests, travel interests, education interests, etc. Category IDs also correspond to user interactions with webpages such that a click on an electric car link will generate a category ID associated with electric cars in the live object related to the interaction with the webpage. One of skill in the art will recognize that there are millions of category IDs. For example, in the case of the union of the category ID corresponding to women over 40 with the category ID corresponding to women with children under two years old would produce as a match a woman over 40 with a child under two years old. Another example is a filtering parameter that includes the category ID corresponding to men who like fishing but excludes the category ID corresponding to people who like to eat fish. Accordingly, a match would correspond to a user who liked to fish but does not eat them. A further example would be a filtering parameter that included a category ID corresponding to liking electric cars or a category ID corresponding to an interest in the environment. A match in this case would be anybody that liked electric cars, or who had an interest in the environment, or both. When there is a match, third-party server 110 provides additional content to web server 113 be delivered to user devices 114 when browsing webpages such as advertising content. Additional content is sent to the user in response to live objects that match a filtering parameter in an ongoing live object request using the tracked data captured in response to a live object request.

Third-party server 110 also initiates requests for estimates of a count of a subset of live objects that would be generated by a live object request using a particular filtering parameter. Third-party server 110 sends such a request to object intake simulation server 111. In response to the request, object intake simulation server 111 requests stored objects from stored object server 112. Object intake simulation server 111 modifies the stored objects so that they have characteristics of a "live object" by, for instance, updating the time stamp to be current. One of skill in the art will recognize that there are numerous methods of modifying stored objects such that they appear to be live objects for live object processing. The object intake simulation server 111 then processes the modified stored objects as live objects with the filtering parameter, applying all of the rules and processes of processing live objects to form a subset of matching stored objects. This includes making sure that any live object counted in the subset would be a live object the object requestor is entitled to receive. For instance, a live object requestor may only be entitled to receive live objects generated from interactions with certain webpage even if live objects generated from other webpages match the filtering parameter. It also includes merging objects that have a same profile, user, or user device ID so that multiple visits to the same web page by the same user that result in distinct stored objects are only counted once. The object intake simulation server 111 will generate a confidence metric during live object simulation. The confidence metric is generated based on the number of stored objects processed and the number of stored objects in the subset of matching objects. In some cases the object intake simulation server 111 will simulate stored objects as live objects until the confidence metric meets a threshold. In other case the object intake simulation server 111 will simulate stored objects for a pre-determined time period and calculate the confidence level for that time period. In other case the live object simulation server 111 might initiate a live object request in response using the filtering parameter in response to the confidence metric meeting a threshold or meeting some other real-time condition.

Figure 2:
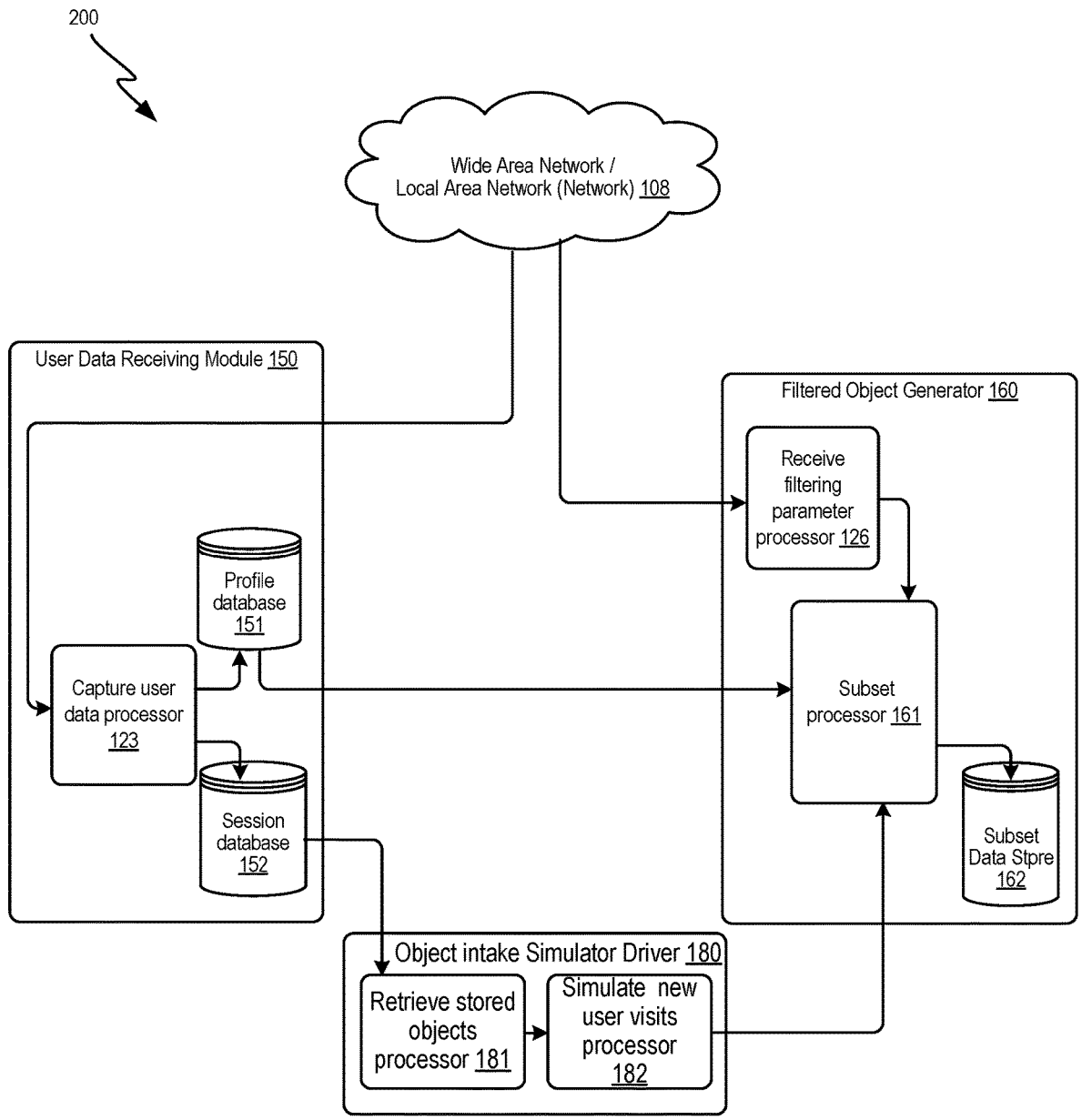
FIG. 2 depicts a system for estimating object count by simulating live object-intake using stored objects.

The system 200 for estimating object count by simulating live object-intake using stored objects in FIG. 2 comprises a user data receiving module 150, object intake simulator driver 180 and a filtered object generator 160. In some embodiments, user data receiving module 150 can operate at stored object server 112. Specifically, user data receiving module 150 can receive user data (and store user profile information) within profile database 151, and user interaction information (e.g., objects, log files, URLs, timestamps, IP addresses, etc.) within session database 152 as stored objects. User data receiving module 150 comprises a capture user data processor 123 that intercepts user data and processes it for storing in the profile database 151 and the session database 152. Capture user data processor 123 receives user data as a result of a placed tracking device such as a cookie, a scripting language, or other mechanism such as commercial analytics tools on user devices when user devices access webpages. The tracking device is placed on the user devices when the user device navigates to a webpage by user device browser. The tracking device serves to collect the interaction data that forms the live objects that are the subject of live object requests and contain the interaction data created by a user device browsing a web page. The tracking device sends the collected interaction data to the user data receiving module 150 where it is placed in session database 152 by the capture user data processor 123. A portion of the contents of session database 152 can age over time, and may become too old to add value to an estimated count of live objects based on a filtering parameter. For example, stored objects that are older than 30 days and that have not been updated during a 30-day period may be excluded for purposes of simulating live objectsObjects that have aged are deleted from session database 152.

Object intake simulation driver 180 comprises a retrieve stored objects processor 181 and a simulate new user visits processor 182 and may be a part of object intake simulation server 111. The retrieve stored objects processor 181 receives stored objects from the session database 152 as long as live object simulation continues. The simulate new user visits processor 182 modifies the stored objects to make them appear to be live objects for live object processing. The modification can take the form of changing the timestamp on the stored object so that it appears to be a live object or any other method of modifying the stored object may be used. The simulate new user visits processor 182 then process the stored objects as if they were live objects by applying all of the live object processing including applying permission rules and merging objects with the same profile, user, or user device IDs.

Filtered object generator 160 comprises a receive filtering parameter processor 126, a subset processor 161, and a subset data store 162. The receive filtering parameter processor 126 receives the filtering parameter from third-party server 110. As part of simulating live object processing, subset processor 161 receives the filtering parameter form receive filtering parameter processor 126 and receives the process stored objects from object intake simulator driver 180. Subset processor 161 filters the processed stored objects to form a subset of objects that match the filtering parameter. Subset processor 161 counts the number of objects in the subset as described in FIG. 1. Subset processor 161 computes a confidence metric as described in FIG. 1. The subset of objects is stored in subset data store 162. In some embodiments the subset of objects is delivered to the third-party server 110.

Figure 3:
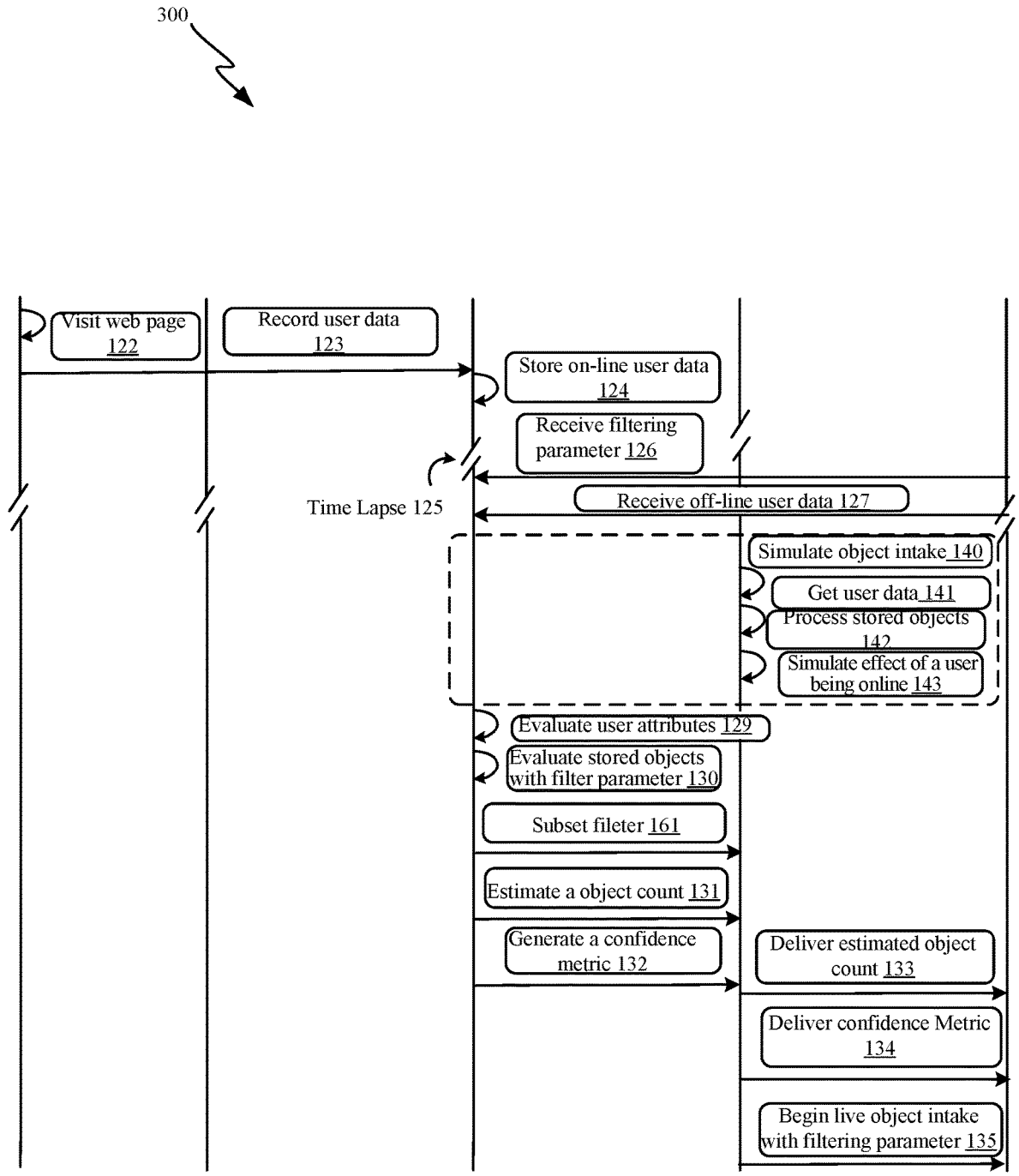
FIG. 3 is a swim diagram of a system for implementing one of the herein-disclosed embodiments.

FIG. 3 is a swim diagram of a system for implementing an embodiment of object count estimation. The aforementioned servers and devices in system 100 are designed and configured to enable a user at user device 114 to visit (e.g., browse) a web page (see operation 122) served by web server 113. When the user device 114 browses the webpage the user device web browser downloads a tracking device as previously discussed. The tracking device sends collected information to the stored object server as live objects that contain interaction data. Live objects are sent to stored object server 112 (see operation 123) after they are processed in response to live object requests. Stored object server 112 receives millions of live objects to store as stored objects each day that are generated from user's interactions with web sites. Stored object server 112 can then store objects (see operation 124). Because stored object server 112 stores so many stored objects, it is time consuming and processor intensive to directly count objects stored by stored object server 112. After some time lapse 125 from minutes to days, object intake simulation server 111 can receive from third-party server 110 a filtering parameter (see operation 126) to use to estimate a live object count by simulating receiving live objects using the stored objects. Stored object server 112 can also receive offline user data from third-party server 110 (see operation 127). Offline user data is generated by activity that occurs offline. For example, a user might visit a content provider at a brick-and-mortar location and volunteer information such as address, phone number, name, etc.

The simulate object-intake 140 generates a new object count estimation (e.g., based on filtering parameters received in operation 126) by simulating live object-intake from stored objects created by a user device visiting a web page (e.g., operation 122). Specifically, simulate object-intake 140 includes first getting stored objects from session database 152 (see operation 141) to object-intake simulation server 111. Object intake simulation server 111 will then modify each stored object to make that stored object appear as if it is a live object. Then object intake simulation server 111 will process each stored object as if it were a live object (see operation 142 and simulate that the users are online (see operation 143). For example, a stored object can be modified to appear as an online visit by creating a tag (e.g., HTTP call) and appending it to the stored object so that appears as if it were created by a user device 114 or web server 113 in the current time period. The object intake simulation server then processes the stored object as if it were live by first evaluating user attributes associated with the stored object (see operation 129). This can be quite complex because stored objects with the same profile ID, user ID, or user device ID are merged so that they appear as one profiles, user, or user device. Each stored object must be a permissible object to include in a result for a live object request. If a stored object is not a permissible object it should not be included when estimating a subset count even if it matches the filtering parameter. Next, the stored object is evaluated for a match to the filtering parameter (see operation 130) and placed in a subset of matching objects if it does.

Object intake simulation server 111 will then estimate a live object count for a live object request using the filtering parameter (see operation 131). First the matching objects in the subset of matching objects are counted. In some cases the subset of matching objects is counted using a HyperLogLog counting method. The HyperLogLog generates a count by first hashing a field in the stored object such as the profile ID with a hashing function that creates a uniform distribution of the stored objects in the subset. The count of the objects in the subset can then be determined based on the spacing between the objects produced by the hashing function. One of skill in the art will recognize that any counting method can be used to count the stored objects in the subset of matching stored objects. The estimate uses the object count of the subset of matching objects, the total number of stored objects processed, the time taken to process the stored objects, and the time period of a potential live object request using the filtering parameter. In some embodiments, simulating object count happens for a predetermined time period. In other embodiments, it continues until a confidence metric meets a particular threshold. Thus, a confidence metric is generated (see operation 132). Generating the confidence metric uses subset count, the processed stored objects count, the time to process the stored objects and other variables. In some embodiments a statistical model is used to generate the confidence metric.

One of three task actions are triggered by the request for estimated object count. A first task action is to deliver the estimated object count (see operation 133). In this case the estimated object count is delivered by the object intake simulation server 111 to the third-party server 110. A second task action is to deliver the confidence metric to the third-party server 110 (see operation 134) along with the estimated object count. In this case, the object intake simulation server 111 may deliver the confidence metric and estimated count after a predetermined amount of time. In other embodiments the confidence metric and estimated count may be delivered to third-party server 110 when the confidence metric meets a threshold. A third task action begins live object processing with the filtering parameter based on a real time filtering condition being satisfied (see operation 135). In some cases the real time filtering condition is the confidence metric exceeding a threshold. In other cases the real time filtering condition may be related to the estimated object count being between an upper and lower bound. One of skill in the art will recognize that there could be many more task actions. For example, an additional task action could cause the object intake simulation server 111 to deliver the subset of matching objects to the third-party server 110 from the subset data storage 162.

Figure 4:
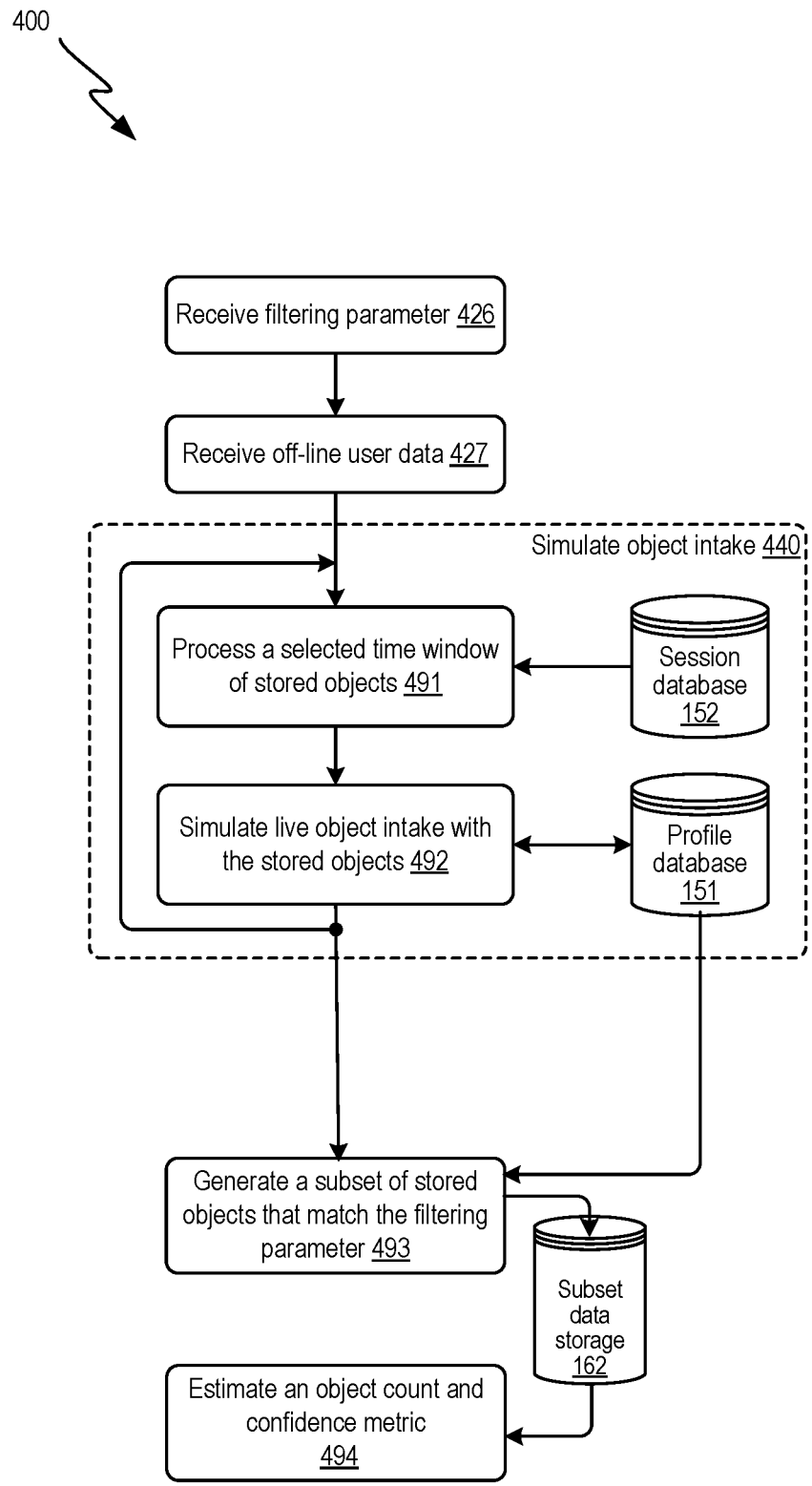
FIG. 4 is a block diagram of a system for implementing all or portions of any of the embodiments described herein.

FIG. 4 presents a logic flow 400 used for estimating an object count for an object requester's filtering parameter. One or more instances of logic flow 400 or any aspect thereof may be implemented in the context of the architecture and functionality of the embodiments described herein. Also, the logic flow 400 or any aspect thereof may be implemented in any desired environment.

Logic flow 400 commences upon receiving the filtering parameter from third-party server 110 (see operation 426). A filtering parameter can include one or more of a category ID, an intersection, union, or exclusion of two or more category IDs, rules related to permissions, a first threshold related to how frequently a user device visits a web page, and a second threshold related to how recently the user device visited a web page. Category IDs include user characteristics such as gender, age, interests, geographic location, preferred language, preferences of all kinds including music and food, etc. One of skill in the art will recognize that there are millions of category IDs. A filtering parameter can include a relationship between two or more category IDs including the union, intersection, or exclusion of two or more category IDs. The object intake simulation server then receives offline user data from third-party server 110 (see operation 427). Offline user data can include the category IDs, a relationship between two or more category IDs, user data including profile IDs, and user characteristics gathered from offline sources. In a set of subsequent operations, a simulate object-intake 440 of the estimated object count request is performed using the filtering parameter. Simulate object-intake 440 begins by identifying time window (e.g., 30 days) of stored objects to process (see operation 491) pulled from session database 152. Older stored objects that fall outside of the time window are not processed to generate an estimated object count because they do not provide currently relevant data and may decrease the accuracy of the estimated count. The estimated object count request can include a customized time window in some embodiments. For instance, the request can include a three-day time window. In such a case, stored objects older than three days are not used to estimate the count of the subset of objects. Each stored object is modified such that it appears to be a live object in order to simulate live object intake with the stored objects at 492. Each stored object is processed at this step to merge it with any other stored objects that shear the same profile ID, user ID, or user device ID using data retrieved from the profile database 151. The stored objects are further processed to reject stored objects that are not generated, for instance, by an allowed webpage associated with the request.

At 493, a subset of stored objects that match the filtering parameter is generated by the object intake simulation server 111. Each stored object that matches the filtering parameter is stored in the subset data storage 162, and in certain embodiments may be delivered to the third-party server 110 in response to a request for the objects. Simulation continues for a predetermined amount of time or until a confidence metric threshold is reached. The estimated count is generated at 494 by first counting the number of stored objects in the subset of matching objects. The count may be generated using a HyperLogLog technique as previously discussed. The estimated object count is generated as a function of the count of the subset of matching objects, the total number of stored objects processed, the time it took to process the stored objects, and a time period spanning the live object request. The confidence metric is computed at 494 as previously discussed using the number of stored objects in the subset and the number of stored objectd processed.

Figure 5A:
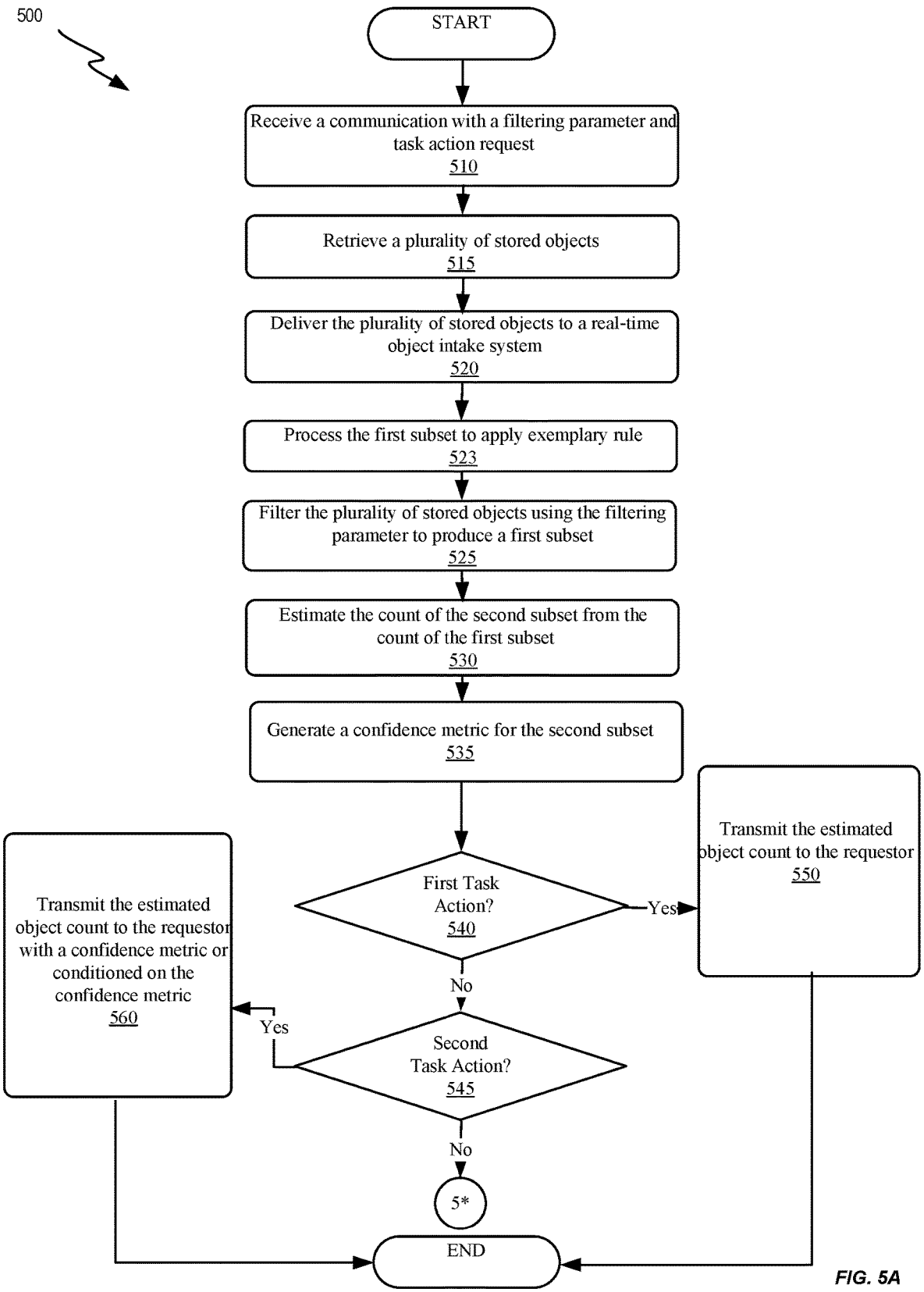
FIG. 5A and FIG. 5B are a flowchart describing estimating object count by simulating live object-intake.
Figure 5B:
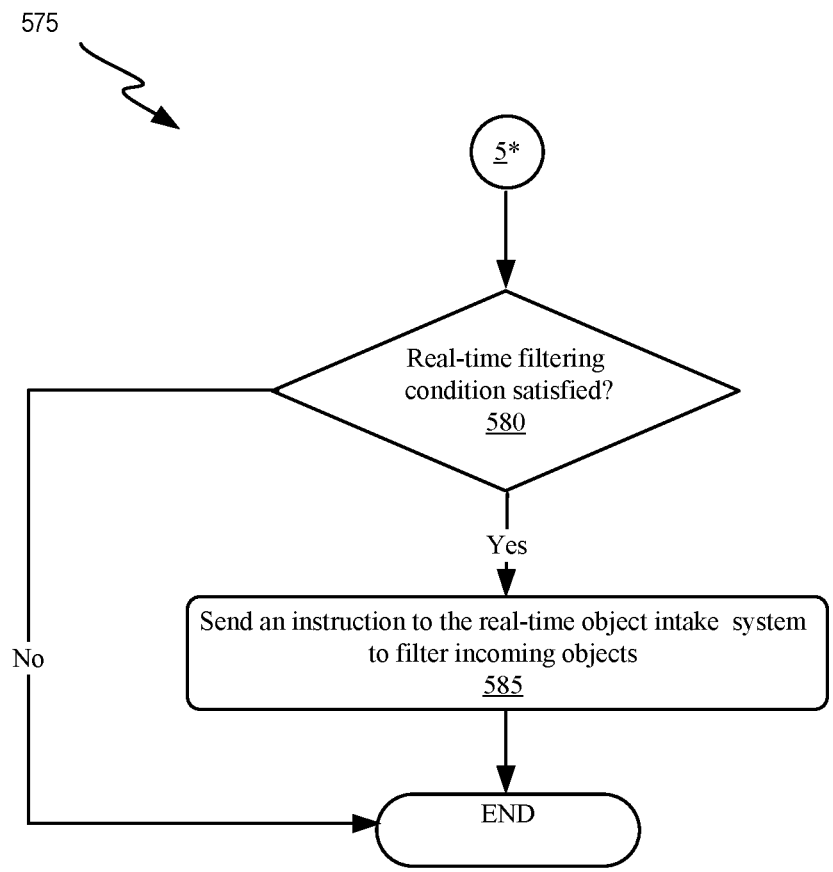

FIGS. 5A and 5B depict a flow chart of estimating object count by simulating live object-intake of stored objects. At block 510 the system 100 receives a request from third-party server 110 for an object count estimate for live delivery of objects conforming to a filtering parameter and a task action for the request. A filtering parameter can include one or more of a category ID, an intersection, union, or exclusion of two or more category IDs, rules related to permissions, a first threshold related to how frequently a user device visits a web page, and a second threshold related to how recently the user device visited a web page. Category IDs include user characteristics such as gender, age, interests, geographic location, preferred language, preferences of all kinds including music and food, etc. One of skill in the art will recognize that there are millions of category IDs. A filtering parameter can include a relationship between two or more category IDs including the union, intersection, or exclusion of two or more category IDs as previously explained in this disclosure. Third-party server 110 provides additional content to web server 113 be delivered to user devices 114 when browsing web pages, such as advertising content in response to live objects that match a filtering parameter in an ongoing live object request. A task action corresponds to a requested action such as, delivering the estimated count to the third-party server 110, conditioning the delivery of the estimated count based on a confidence metric, delivering the confidence metric, and beginning live object processing of the filtering parameter if a real-time condition is met. Further actions could include delivering the subset of matching objects. One of skill in the art will recognize that these are just a few examples of many types of task actions that the request could ask to be completed.

At block 515, stored object server 112 retrieves stored objects from session database 152. The stored objects are generated when user devices interaction with web pages by tracking mechanisms placed on the user device by the web browser when browsing the web page as previously discussed. At block 520 the stored objects are sent to object-intake simulation server 111 where they are prepared for and processed as live objects. As previously discussed, there are many techniques that can be used to prepare a stored object to appear to be a live object, including changing the time stamp so that the stored object appears to be generated live, adding tags such as html, adding scripts, etc. At block 523 the stored objects are processed to apply exemplary rules that affect counting objects. This processing closely resembles live object processing in that it applies exemplary rules to the stored objects. An exemplary rule may indicate that a stored object may only increase a subset object count if the stored object's characteristic(s) match the filtering parameter and the subset object count does not already reflect an instance corresponding to the stored object (e.g., the count not having been previously iterated for another stored object associated with an identifier of a profile, user, device and/or session).

The stored objects are merged together upon detecting that a stored object being presently processed includes one or more of the same or corresponding identifiers (e.g., of user, device and/or session) as one having been previously processed. In effect, a merged stored object may be generated and updated for each unique one or more identifiers, where the profile includes some or all unique elements from the object (e.g., characterizing a user, representing an individual webpage interaction, identifying device characteristics, etc.). Stored objects have identifying fields including, for instance, user IDs, user device IDs, profile IDs, and other fields representing unique characteristics of a user. Each of these identifying fields may be selected as the field used to decide to merge stored objects. For example, if the user ID is used to merge objects then generally all stored objects with the same user ID will be merged regardless of what device the associated user used to access a web page. The resulting merged stored object will contain all of the unique characteristics of each of the individual stored objects. For instance, if one stored object indicated that a user with user ID john.smith was interested in electric cars, a second stored object indicated that the user with user ID john.smith was interested learning French, and a third stored object indicated that the user with user ID john.smith was interested in judo, then the merged stored object would indicate that the user with user ID john.smith was interested in electric cars, learning French, and judo. Furthermore, many other characteristics of each stored object will be merged into the merged stored object, such as the number of times the user went to the same electric car webpage and date and time of each visit. In another example, the user device ID could alternately be selected such that all stored objects with the same user device ID will be merged. In this example, there could still be multiple instances of stored objects that have the same user ID, but only one merged stored object for the user device ID. That merged stored object would contain all of the characteristics of each individual stored object comprising the user device ID.

Another exemplary rule that may be alternatively or additionally applied to stored objects includes a permission rule. A permission rule may restrict objects for which data can be accessed, and thus they may not be added to the subset or counted. For example, a permission rule may identify that a particular client can only receive live objects based on characteristics derived from objects associated with one or more websites owned by the client or associated with the client. Any stored object from other websites may not be added to the subset of matching objects even if it otherwise matched the filtering parameter. Thus, restricted objects are not included when determining the subset count. Further, the object-merging operation may be conducted only when it is determined that two or more unerlying objects correspond to or include one or more same or corresponding identifiers and also that each of the two or more unerlying objects is associated with a website of the one or more websites, and thus, neither is restricted. If two stored objects share the same user ID, but one is not associated with a website of the one or more websites, then the stored objects may not be merged. In this case, the stored object associated with the one or more websites may be added to the subset and counted if it matches the filtering parameter. After applying exemplary rules, at block 525 the stored objects are filtered according to the filtering parameter to create a first subset of objects. The first subset of objects does not include stored objects merged into another stored object or restricted objects.

Once the exemplary rules are applied and filtering is performed to create a first subset of objects, the objects in the subset are counted. Many different counting techniques may be used, including a HyperLogLog estimation. The HyperLogLog estimates a count of the subset of stored objects by applying a hashing function to a field in the stored objects such as the profile ID field. The hasing function used is selected to cause a uniform distribution of the the profile IDs of the stored objects in the subset. The count of the first subset of objects can be estimated, then, based on the distance between stored objects after the hashing function has uniformly spread the stored objects.

At block 530 the estimated count of a second subst of objects is generated from the count of the first subset of live objects. Different estimation techniques may be used to generate the estimated count including projecting the count of the second subset of objects based on the count of the first subset of stored objects, the total number of stored objects processed to produce the first subste of stored objects, a first time period used to process the total number of stored objects, and a second time period selected to collect live objects with the filtering parameter. Next, at block 535, a confidence metric for the estimated count of the second subset is generated. Different techniques may be used to generate a confidence metric including using a statistical model. At block 540 if a first task action is required the estimated object count is transmitted to the third-party server 110 at block 550. Otherwise at block 545 if the a second task action is required, the estimated object count is transmitted to the third-party server 110 with the confidence metric or conditioned on the confidence metric at block 560. Otherwise at block 580 if a real time filtering condition is satisfied then live object-intake with the filtering paramater is started for the object requester at block 585. One of skill in the art will recognize that many more task actions could be completed including sending the subset of stored objects to the third-party server 110.

Various environment in which embodiments of the disclosure operate may include local area networks (LANs)/wide area networks (WANs), wireless networks, user devices (e.g., user stations). The overall network includes any sub-networks and/or wireless networks are in communication with, and enables communication between each of the components of the environment.

Instances of user devices may include virtually any computing device capable of communicating over a network to send and receive information, including instant messages, performing various online activities or the like. It should be recognized that more or fewer user devices may be included within a system such as described herein, and embodiments are therefore not constrained by the number or type of user devices employed.

Devices that may operate as user devices may include devices that can connect using a wired or wireless communications medium such as personal computers, servers, multiprocessor systems, microprocessor-based or programmable consumer electronics, network PCs or the like. In some embodiments, user devices may include virtually any portable computing device capable of connecting to another computing device and receiving information such as a laptop computer, a smart phone, a tablet computer, or the like. Portable or mobile computer devices may also include or operate in conjunction with other portable devices such as cellular telephones, display pagers, radio frequency (RF) devices, infrared (IR) devices, personal digital assistants (PDAs), handheld computers, wearable computers integrated devices combining one or more of the preceding devices, and the like. As such, user devices can range widely in terms of capabilities and features. Moreover, user devices may provide access to various computing applications including a browser or other web-based applications. A web-enabled user device may include a browser application that is configured to receive and to send web pages, web-based messages and the like. The browser application may be configured to receive and display graphics, text, multimedia and the like, employing virtually any web-based language including a wireless application protocol messages (WAP) and the like. In one embodiment, the browser application is enabled to employ handheld device markup language (HDML), wireless markup language (WML), WMLScript, JavaScript, standard generalized markup language (SGML), HyperText markup language (HTML), eXtensible markup language (XML) and the like, to display and send a message. In one embodiment, a user of the user device may employ the browser application to perform various activities over a network (online). However, another application may also be used to perform various online activities.

User devices may include at least one user application that is configured to receive and/or send data between another computing device (e.g., a server component). The user application may include a capability to provide, send, and/or receive content or the like. The user application may further provide information that identifies itself including a type, capability, name, or the like. In one embodiment, a user device may uniquely identify itself through any of a variety of mechanisms including a phone number, mobile identification number (MIN), an electronic serial number (ESN), or other mobile device identifier. The information may also indicate a content format that the mobile device is enabled to employ. Such information may be provided in a network packet or the like, sent between other user devices, or sent between other computing devices.

User devices may be further configured to include a user application that enables an end-user to log into an end-user account that may be managed by another computing device. Such end-user accounts, in one non-limiting example, may be configured to enable the end-user to manage one or more online activities including, in one non-limiting example, search activities, social networking activities, browse various websites, communicate with other users, participate in gaming, interact with various applications, or the like. However, participation in online activities may also be performed without logging into the end-user account.

A wireless communication capability is configured to couple user devices and other components within the network. Wireless network may include any of a variety of wireless sub-networks that may further overlay stand-alone and/or ad-hoc networks and the like, to provide an infrastructure-oriented connection for user devices. Such sub-networks may include mesh networks, wireless LAN (WLAN) networks, cellular networks and the like. In one embodiment, the system may include more than one wireless network.

A wireless network may further include an autonomous system of terminals, gateways, routers, mobile network edge devices, and the like which may be connected by wireless radio links, etc. Connections may be configured to move freely and randomly and organize themselves arbitrarily such that the topology of a wireless network may change rapidly. A wireless network may further employ a plurality of access technologies including AMPS and/or second generation (2G), and/or third generation (3G), and/or fourth generation (4G) generation radio access for cellular systems, WLAN, wireless router (WR) mesh and the like. The foregoing access technologies as well as emerging and/or future access technologies may enable wide area coverage for mobile devices such as user devices with various degrees of mobility. In one non-limiting example, the wireless network may enable a radio connection through a radio network access such as a global system for mobile (GSM) communication, general packet radio services (GPRS), enhanced data GSM environment (EDGE), wideband code division multiple access (WCDMA), and the like. A wireless network may include any wireless communication mechanism by which information may travel between user devices and/or between another computing device or network.

Any of the foregoing networks can be configured to couple network devices with other computing devices and communication can include communicating with the Internet. In some situations communication is carried out using combinations of LANs, WANs, as well as direct connections such as through a universal serial bus (USB) port, or other forms of computer readable media. On an interconnected set of LANs, including those based on differing architectures and protocols, a router acts as a link between LANs, enabling messages to be sent from one to another. In addition, communication links within LANs may include twisted wire pair or coaxial cable, while communication links between networks may use analog telephone lines, full or fractional dedicated digital lines including T1, T2, T3, and T4, and/or other carrier mechanisms including, for example, E-carriers, integrated services digital networks (ISDNs), digital subscriber lines (DSLs), wireless links including satellite links, or other communications links known to those skilled in the art. Moreover, communication links may further employ any of a variety of digital signaling technologies including, without limit, for example, DS-0, DS-1, DS-2, DS-3, DS-4, OC-3, OC-12, OC-48 or the like. Furthermore, remote computers and other related electronic devices can be remotely connected to either LANs or WANs via a modem and temporary telephone link. In one embodiment, network 108 may be configured to transport information of an Internet protocol (IP). In some cases, communication media carries computer readable instructions, data structures, program modules, or other transport mechanism and includes any information delivery media. By way of example, communication media includes wired media such as twisted pair, coaxial cable, fiber optics, wave guides, and other wired media and wireless media such as acoustic, RF, infrared, and other wireless media. Specific details are given in the above description to provide a thorough understanding of the embodiments. However, it is understood that the embodiments can be practiced without these specific details. For example, circuits can be shown in block diagrams in order not to obscure the embodiments in unnecessary detail. In other instances, well-known circuits, processes, algorithms, structures, and techniques can be shown without unnecessary detail in order to avoid obscuring the embodiments.

Implementation of the techniques, blocks, steps and means described above can be done in various ways. For example, these techniques, blocks, steps and means can be implemented in hardware, software, or a combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments can be described as a process which is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. A process is terminated when its operations are completed, but could have additional steps not included in the figure. A process can correspond to a method, a function, a procedure, a subroutine, a subprogram, etc. When a process corresponds to a function, its termination corresponds to a return of the function to the calling function or the main function.

Furthermore, embodiments can be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks can be stored in a machine readable medium such as a storage medium. A code segment or machine-executable instruction can represent a procedure, a function, a subprogram, a program, a routine, a subroutine, a module, a software package, a script, a class, or any combination of instructions, data structures, and/or program statements. A code segment can be coupled to another code segment or a hardware circuit by passing and/or receiving information, data, arguments, parameters, and/or memory contents. Information, arguments, parameters, data, etc. can be passed, forwarded, or transmitted via any suitable means including memory sharing, message passing, ticket passing, network transmission, etc.

For a firmware and/or software implementation, the methodologies can be implemented with modules (e.g., procedures, functions, and so on) that perform the functions described herein. Any machine-readable medium tangibly embodying instructions can be used in implementing the methodologies described herein. For example, software codes can be stored in a memory. Memory can be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" can represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels, and/or various other storage mediums capable of storing that contain or carry instruction(s) and/or data.

While the principles of the disclosure have been described above in connection with specific apparatuses and methods, it is to be clearly understood that this description is made only by way of example and not as limitation on the scope of the disclosure.

In the foregoing specification, the disclosure has been described with reference to specific embodiments thereof. It will be evident, however, that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A method of generating and using estimated object counts based on simulations of processing real-time data streams, the method comprising:
    receiving a communication that identifies a filtering parameter, wherein the communication corresponds to a request to perform a task action based on a simulated output that is generated according to the filtering parameter;
    performing a simulation of processing one or more real-time data streams by:
        retrieving a first plurality of stored objects, each stored object of the first plurality of stored objects having been generated based on an interaction-responsive communication received from a user device; and
        filtering the first plurality of stored objects using the filtering parameter to produce a first subset of the first plurality of stored objects, each object in the first subset corresponding to the filtering parameter;
    processing the first subset to identify an object count to associate with the filtering parameter, the object count identifying a quantity of objects in the first subset that include one or more unique values for one or more particular identifying fields relative to other one or more values for the one or more particular identifying fields represented in the quantity of objects in the first subset, the object count being less than a number of objects in the first subset as a result of at least two objects in the first subset having one or more non-unique values for the one or more particular identifying fields, wherein processing the first subset to identify an object count includes:
  applying a permission rule to the first subset, the permission rule indicating that objects that are associated with a particular webpage are to be included in the object count;
  determining, based on the permission rule, that at least one object of the first subset is associated with a different webpage;
  restricting, in response to determining that at least one object of the first subset is not associated with the particular webpage, the at least one object from being included the object count;
  applying a hashing function to the one or more particular identifying fields of objects in the first subset to generate a distribution of the one or more particular identifying fields of the objects in the first subset; and
  estimating the object count based on a distance between the one or more particular identifying fields of the objects in the first subset in the distribution;
generating response data that includes an estimated count of a second subset of a second plurality of objects based on the object count, the second plurality of objects including at least one object expected to be received subsequent to the identification of the object count, each object in the second subset corresponding to the filtering parameter;
generating a confidence metric based on a quantity of objects in the second plurality of objects and the estimated count of the second subset of the second plurality of objects;
determining that the confidence metric exceeds a threshold; and
performing, in response to determining that the confidence metric exceeds a threshold, the task action, the task action including:
  transmitting a response to the communication that identifies the estimated count of the response data; or
  filtering, in response to a determination that a real-time filtering condition is satisfied, incoming objects from one or more real-time data streams using the filtering parameter.

2. The method of generating and using estimated object counts based on simulations of processing real-time data streams of claim 1, wherein the confidence metric is generated using a statistical model.

3. The method of generating and using estimated object counts based on simulations of processing real-time data streams of claim 1, wherein the filtering parameter includes one or more of:
  a category identifier (ID);
  a logical union, intersection, or exclusion of two or more category IDs;
  a rule, wherein the rule corresponds to a permission characteristic;
  a first threshold, wherein the first threshold corresponds to a frequency of occurrence; and
  a second threshold, wherein the second threshold corresponds to a time of occurrence.

4. The method of estimating an object count by simulating live object-intake using a database of stored objects of claim 1 wherein the interaction-responsive communication originated from a web page visit.

5. The method of generating and using estimated object counts based on simulations of processing real-time data streams of claim 1, wherein the object count of the first subset of the first plurality of stored objects is calculated using a HyperLogLog algorithm.

6. A system for generating and using estimated object counts based on simulations of processing real-time data streams, the system comprising:
  one or more data processors; and
  a non-transitory computer readable storage medium containing instructions which when executed on the one or more data processors, cause the one or more data processors to perform actions including:
  receiving a communication that identifies a filtering parameter, wherein the communication corresponds to a request to perform a task action based on a simulated output generated according to the filtering parameter;
  performing a simulation of processing one or more real-time data streams by:
    retrieving a first plurality of stored objects, each stored object of the first plurality of stored objects having been generated based on an interaction-responsive communication received from a user device; and
    filtering the first plurality of stored objects using the filtering parameter to produce a first subset of the first plurality of stored objects, each object in the first subset corresponding to the filtering parameter;
  processing the first subset to identify an object count to associate with the filtering parameter, the object count identifying a quantity of objects in the first subset that include one or more unique values for one or more particular identifying fields relative to other one or more values for the one or more particular identifying fields represented in the quantity of objects in the first subset, the object count being less than a number of objects in the first subset as a result of at least two objects in the first subset having one or more non-unique values for the one or more particular identifying fields, wherein processing the first subset to identify an object count includes:
    applying a permission rule to the first subset, the permission rule indicating that objects that are associated with a particular webpage are to be included in the object count;
    determining, based on the permission rule, that at least one object of the first subset is associated with a different webpage;
    restricting, in response to determining that at least one object of the first subset is not associated with the particular webpage, the at least one object from being included the object count;
    applying a hashing function to the one or more particular identifying fields of objects in the first subset to generate a distribution of the one or more particular identifying fields of the objects in the first subset; and
    estimating the object count based on a distance between the one or more particular identifying fields of the objects in the first subset in the distribution;
  generating response data that includes an estimated count of a second subset of a second plurality of objects based on the object count, the second plurality of objects including at least one object expected to be received subsequent to the identification of the object count, each object in the second subset corresponding to the filtering parameter; and generating a confidence metric based on a quantity of objects in the second plurality of objects and the estimated count of the second subset of the second plurality of objects;

determining that the confidence metric exceeds a threshold; and performing, in response to determining that the confidence metric exceeds a threshold, the task action, the task action including:
  transmitting a response to the communication that identifies the estimated count of the response data; or
  filtering, in response to a determination that a real-time filtering condition is satisfied, incoming objects from one or more real-time data streams using the filtering parameter.

7. The system for generating and using estimated object counts based on simulations of processing real-time data streams of claim 6, wherein the confidence metric is generated using a statistical model.

8. The system for generating and using estimated object counts based on simulations of processing real-time data streams of claim 6, wherein the filtering parameter comprises one or more of:
  a category identifier (ID);
  a logical union, intersection, or exclusion of two or more category IDs;
  a rule, wherein the rule corresponds to a permission characteristic;
  a first threshold, wherein the first threshold corresponds to a frequency of occurrence; and
  a second threshold, wherein the second threshold corresponds to a time of occurrence.

9. The system for generating and using estimated object counts based on simulations of processing real-time data streams of claim 6, wherein the interaction-responsive communication originated from a web page visit.

10. The system for generating and using estimated object counts based on simulations of processing real-time data streams of claim 6, wherein the object count of the first subset of the first plurality of stored objects is calculated using a HyperLogLog estimation.

11. A computer-program product tangibly embodied in a non-transitory machine-readable storage medium, including instructions configured to cause one or more data processors to perform actions for generating and using estimated object counts based on simulations of processing real-time data streams, the actions including:
  receiving a communication that identifies a filtering parameter, wherein the communication corresponds to a request to perform a task action based on a simulated according to generated according to the filtering parameter;
  performing a simulation of processing one or more real-time data streams by:
    retrieving a first plurality of stored objects, each stored object of the first plurality of stored objects having been generated based on an interaction-responsive communication received from a user device; and
    filtering the first plurality of stored objects using the filtering parameter to produce a first subset of the first plurality of stored objects, each object in the first subset corresponding to the filtering parameter;
  processing the first subset to identify an object count to associate with the filtering parameter, the object count identifying a quantity of objects in the first subset that include one or more unique values for one or more particular identifying fields relative to other one or more values for the one or more particular identifying fields represented in the quantity of objects in the first subset, the object count being less than a number of objects in the first subset as a result of at least two objects in the first subset having one or more non-unique values for the one or more particular identifying fields, wherein processing the first subset to identify an object count includes:
    applying a permission rule to the first subset, the permission rule indicating that objects that are associated with a particular webpage are to be included in the object count;
    determining, based on the permission rule, that at least one object of the first subset is associated with a different webpage;
    restricting, in response to determining that at least one object of the first subset is not associated with the particular webpage, the at least one object from being included the object count;
    applying a hashing function to the one or more particular identifying fields of objects in the first subset to generate a distribution of the one or more particular identifying fields of the objects in the first subset; and
    estimating the object count based on a distance between the one or more particular identifying fields of the objects in the first subset in the distribution;
  generating response data that includes an estimated count of a second subset of a second plurality of objects based on the object count, the second plurality of objects including at least one object expected to be received subsequent to the identification of the object count, each object in the second subset corresponding to the filtering parameter;
  generating a confidence metric based on a quantity of objects in the second plurality of objects and the estimated count of the second subset of the second plurality of objects;
  determining that the confidence metric exceeds a threshold; and
  performing, in response to determining that the confidence metric exceeds a threshold, the task action, the task action including:
    transmitting a response to the communication that identifies the estimated count of the response data; or
    filtering, in response to a determination that a real-time filtering condition is satisfied, incoming objects from one or more real-time data streams using the filtering parameter.

12. The computer-program product for generating and using estimated object counts based on simulations of processing real-time data streams of claim 11, wherein the filtering parameter comprises one or more of:
  a category identifier (ID);
  a logical union, intersection, or exclusion of two or more category IDs;
  a rule, wherein the rule corresponds to a permission characteristic;
  a first threshold, wherein the first threshold corresponds to a frequency of occurrence; and
  a second threshold, wherein the second threshold corresponds to a time of occurrence.

13. The computer-program product for generating and using estimated object counts based on simulations of processing real-time data streams of claim 11, wherein the interaction-responsive communication originated from a web page visit.

14. The computer-program product for generating and using estimated object counts based on simulations of processing real-time data streams of claim 11, wherein the object count of the first subset of the first plurality of stored objects is calculated using a HyperLogLog estimation.

* * * * *

UNITED STATES PATENT AND TRADEMARK OFFICE
CERTIFICATE OF CORRECTION

Page 1 of 1

PATENT NO. : 11,120,176 B2
APPLICATION NO. : 15/797652
DATED : September 14, 2021
INVENTOR(S) : Anping Wang et al.

It is certified that error appears in the above-identified patent and that said Letters Patent is hereby corrected as shown below:

In the Specification

In Column 9, Line 40, delete "objectsObjects" and insert -- objects -- therefor.

In the Claims

In Claim 4:
In Column 20, Line 1, "The method of estimating an object count by simulating live object-intake using a database of stored objects" should be changed to -- The method of generating and using estimated object counts based on simulations of processing real-time data streams --.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*